United States Patent
Marsanne et al.

(10) Patent No.: US 8,907,692 B2
(45) Date of Patent: Dec. 9, 2014

(54) METHODS OF USING A CONDUCTIVE COMPOSITE MATERIAL

(75) Inventors: Sebastien Marsanne, Singapore (SG); Boon Nam Poh, Singapore (SG); Samuel Devanandan, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 1375 days.

(21) Appl. No.: 12/641,793

(22) Filed: Dec. 18, 2009

(65) Prior Publication Data

US 2011/0147191 A1    Jun. 23, 2011

(51) Int. Cl.
  *G01R 31/00*    (2006.01)
  *G01R 31/28*    (2006.01)

(52) U.S. Cl.
  CPC ................... *G01R 31/2818* (2013.01)
  USPC ............ 324/755.09; 324/755.08; 324/754.18; 324/754.3

(58) Field of Classification Search
  USPC ............... 324/754.18, 754.02, 754.48, 754.3, 324/755.08, 755.09
  See application file for complete search history.

(56) References Cited

U.S. PATENT DOCUMENTS

| | | | | |
|---|---|---|---|---|
| 4,740,657 | A * | 4/1988 | Tsukagoshi et al. | 174/88 R |
| 4,935,696 | A * | 6/1990 | DiPerna | 324/750.2 |
| 5,206,585 | A * | 4/1993 | Chang et al. | 324/756.05 |
| 5,445,308 | A * | 8/1995 | Nelson et al. | 228/121 |
| 5,661,042 | A * | 8/1997 | Fang et al. | 438/17 |
| 6,270,363 | B1 * | 8/2001 | Brofman et al. | 439/91 |
| 6,562,637 | B1 * | 5/2003 | Akram et al. | 438/14 |

* cited by examiner

*Primary Examiner* — Richard Isla Rodas
(74) *Attorney, Agent, or Firm* — Gardere Wynne Sewell LLP

(57) ABSTRACT

Composite materials having conductive properties are described for use in testing circuits and in manufacturing electrical switches. The composite materials described, when in an unstressed state, generally behave as insulators. However, when sufficient mechanical pressure is applied to portions of the composite materials, the portions to which the mechanical pressure is applied become increasingly conductive. Methods for testing a PCB using composite material switches are also disclosed. A sheet that includes a composite material may be used to test electrical functionality of various regions on a PCB by way of local pressure application. The sheet may be easily applied to and removed from the PCB. Additionally, in forming an electrical switch, a voltage applied to one or more actuating elements may be used to provide mechanical pressure to a composite material that is disposed between two conductive members. Application of a sufficient voltage allows for portions of the composite material to transition from an insulator to a conductor for providing an electrical pathway.

8 Claims, 13 Drawing Sheets

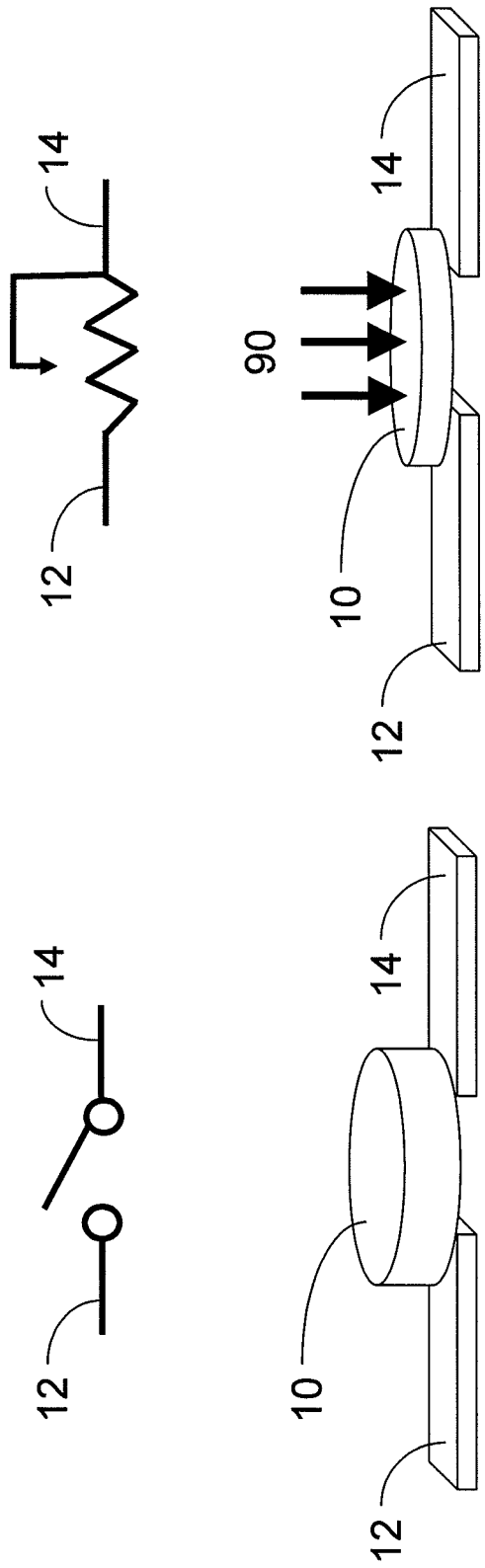

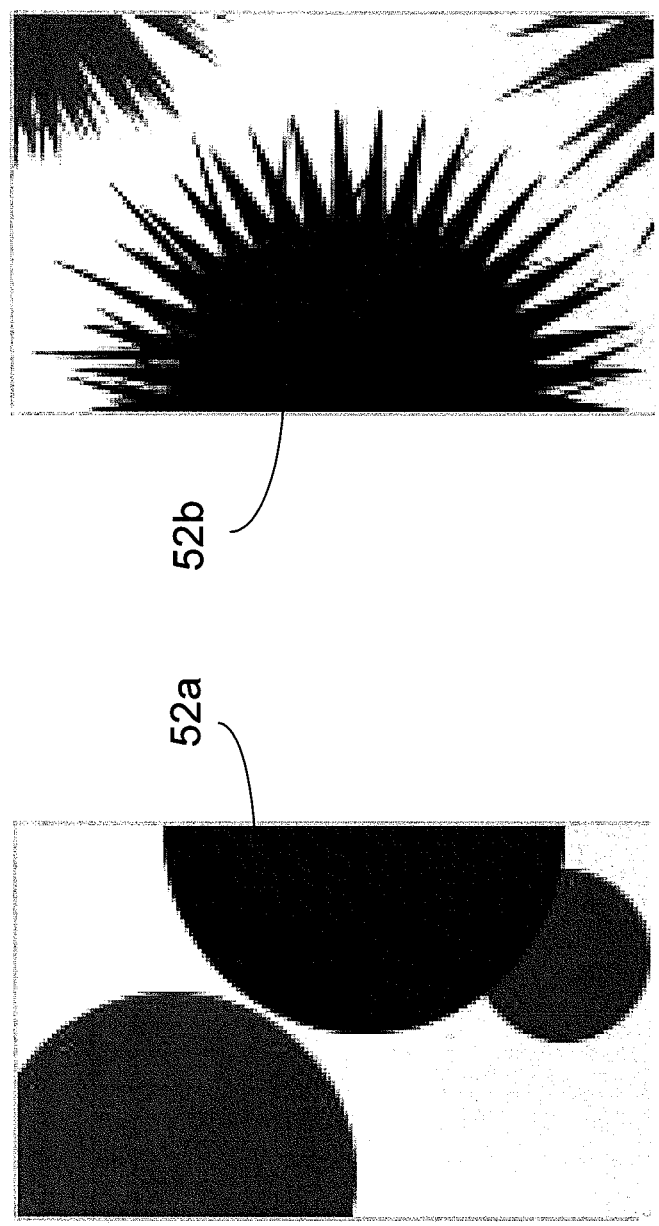

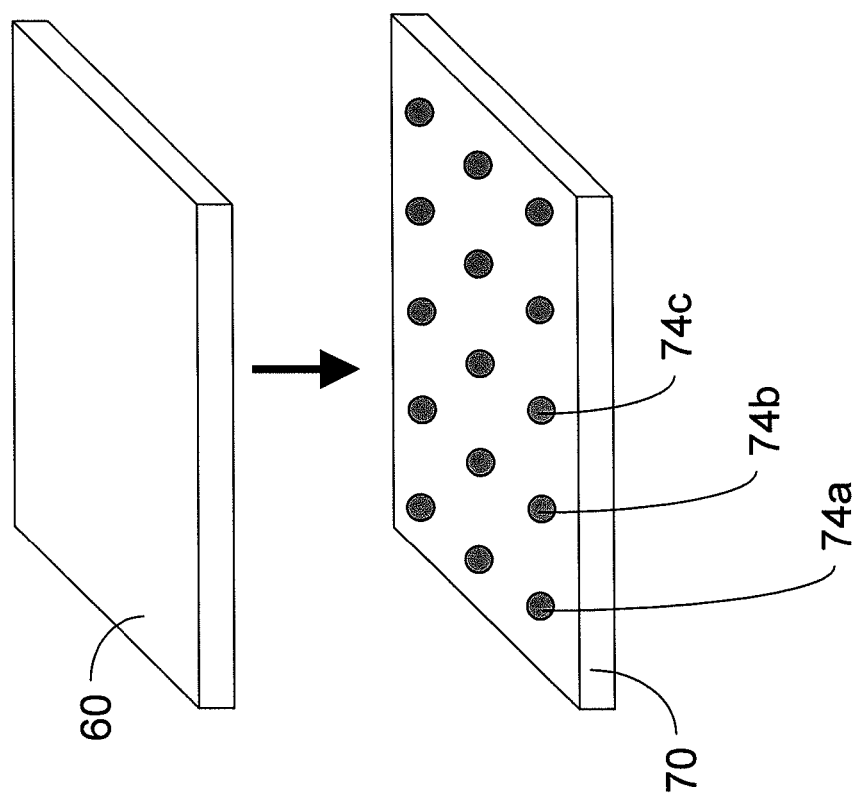

METHODS OF USING A CONDUCTIVE COMPOSITE MATERIAL

BACKGROUND

1. Field

Aspects herein relate to methods for using a composite material having conductive properties for electronic applications. Aspects relating to methods of testing a circuit are described. Aspects described also relate to use of a composite material for an electrical switch.

2. Discussion of Related Art

When manufacturing integrated circuit or surface mount packages (e.g., ball grid array, quad flat no leads, and quad flat packages), testing is performed at one or more stages to help ensure that the finished product functions adequately and reliably. In some manufacturing operations, printed circuit boards (PCB) are first tested before any components are mounted to them. Once components are attached, populated PCBs are tested again, either simply to ensure that the components are properly connected to the PCBs or to test the functionality of the assembly. In some cases, to provide debugging and reliability testing, sockets are used so that several devices may be tested on a single PCB. However, sockets can be expensive and may take up board space.

SUMMARY

In one illustrative embodiment a method of testing a printed circuit board using a composite material is provided. The method includes forming a flexible sheet, the flexible sheet including the composite material; applying the flexible sheet to the printed circuit board such that the flexible sheet is disposed on the printed circuit board, wherein the composite material contacts the printed circuit board; applying a pressure to a top surface of the flexible sheet, and as a result to a portion of the composite material, while the flexible sheet is disposed on the printed circuit board, wherein application of the pressure to the flexible sheet causes the portion of the composite material to become less electrically resistant and an electrical pathway is created on a section of the printed circuit board that is adjacent to the portion of the composite material that is under pressure; measuring an electrical functionality of at least the section of the printed circuit board based on the electrical pathway that is created; and removing the flexible sheet from the printed circuit board at a completion of a test.

In another illustrative embodiment, an electrical switch is provided. The switch includes a first conductive member; a second conductive member disposed adjacent to the first conductive member; a composite material disposed between the first conductive member and the second conductive member; and at least one actuating element that is configured to apply a pressure to a portion of the composite material through at least one of the first conductive member or the second conductive member when a voltage difference is applied to the at least one actuating element, wherein upon application of the pressure to the portion of the composite material, the portion of the composite material becomes less electrically resistant and an electrical pathway is created between the first conductive member and the second conductive member.

In a further illustrative embodiment, a method of using an electrical switch is provided. The method includes providing a first conductive member and a second conductive member, the first and second conductive members being disposed adjacent one another; providing a composite material disposed between the first and second conductive members; providing at least one actuating element connected to a rigid portion; providing a voltage difference to the at least one actuating element so as to actuate the at least one actuating element and create a pressure on the rigid portion, the pressure being applied to a portion of the composite material; and creating an electrical pathway between the first conductive member and the second conductive member, wherein upon application of the pressure to the portion of the composite material, the portion of the composite material becomes less electrically resistant so that the electrical pathway is created.

Various embodiments of the present invention provide certain advantages. Not all embodiments of the invention share the same advantages and those that do may not share them under all circumstances.

Further features and advantages of the present invention, as well as the structure of various embodiments of the present invention are described in detail below with reference to the accompanying drawings.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. Various embodiments of the invention will now be described, by way of example, with reference to the accompanying drawings, in which:

FIG. 1A is a prior art depiction of a composite material that connects two conductive tracks where no pressure is applied to the composite material;

FIG. 1B is a prior art depiction of the composite material that connects the two conductive tracks of FIG. 1A, where a variable amount of pressure is applied to the composite material;

FIG. 1C is a prior art depiction of a conductive particle having round and smooth features for inclusion in a composite material;

FIG. 1D is a prior art depiction of a conductive particle having spiked features for inclusion in a composite material;

FIG. 3 depicts an embodiment of a composite material to be used for testing on a ball grid array;

DETAILED DESCRIPTION

Figure 2A:
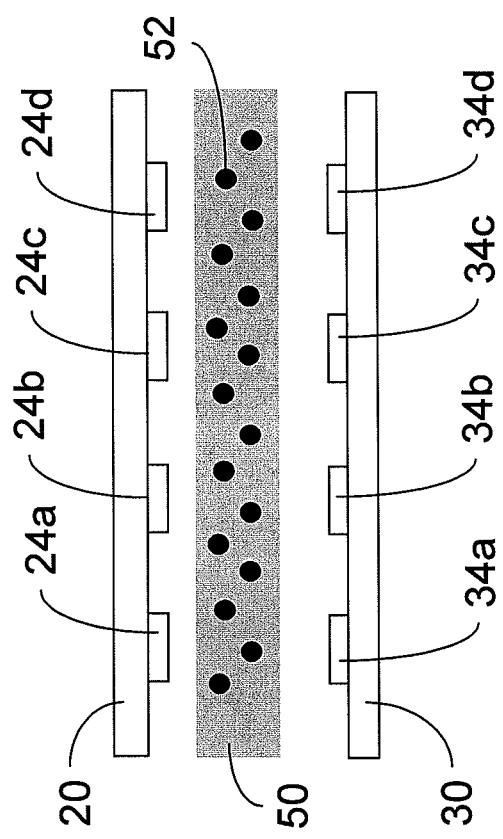
FIG. 2A depicts a composite material disposed between two circuits.

Aspects herein are not limited in their application to the details of construction and the arrangement of components set forth in the following description or illustrated in the drawings. Other embodiments may be employed and aspects may be practiced or be carried out in various ways. Also, the phraseology and terminology used herein is for the purpose of description and should not be regarded as limiting. The use of "including," "comprising," "having," "containing," "involving," and/or variations thereof herein, is meant to encompass the items listed thereafter and equivalents thereof as well as additional items.

Methods for using a composite material having conductive properties for electronic applications are described. Such methods include using a composite material to test circuits and using a composite material for manufacture of an electrical switch. The composite material, in an unstressed state, generally functions as an insulator. When a sufficient pressure is applied to portions of the composite material, those portions of the composite material where the pressure is applied then exhibit conductive characteristics.

In illustrative embodiments presented, a flexible sheet that includes a composite material is applied to a PCB. The electrical functionality of various regions on the PCB may be tested by application of a pressure to the flexible sheet that is sufficient for the composite material to behave as a conductor at the region(s) where pressure is applied. Pressure is applied at portions of the sheet that correspond to the areas on the PCB to be tested. After testing of the PCB using the flexible sheet having the composite material, the sheet may be easily removed from the PCB.

In other illustrative embodiments, a composite material disposed between two conductive members is used to form an electrical switch that may behave similar to a transistor. Application of a voltage difference to one or more actuating elements supplies a sufficient mechanical pressure to the composite material to provide an electrical pathway between conductive members. The switch is considered to be "closed" or "on" when such an electrical pathway exists. Prior to voltage application to the one or more actuating elements, no mechanical pressure is supplied to the composite material sufficient for the composite material to function as a conductor, resulting in the absence of an electrical pathway between conductive members. The switch is considered to be "open" or "off" when the electrical pathway is absent.

FIGS. 1A and 1B depict schematic representation of a conventional application of a composite material 10 in contact with conductive tracks 12 and 14. In FIG. 1A, composite material 10 is unstressed and behaves as an insulator. Accordingly, FIG. 1A effectively illustrates an open switch configuration where no electrical pathway is established between conductive tracks 12 and 14. However, when an adequate pressure 90 is applied to composite material 10, the composite material behaves as a conductor and an electrical pathway is established between conductive tracks 12 and 14. Depending on the amount of pressure 90 that is applied to composite material 10, the resistance may decrease accordingly. If the pressure 90 is slight, the resistance of composite material 10 will only decrease slightly. If the pressure 90 is large, the resistance of composite material 10 will decrease significantly. Thus, FIG. 1B shows a variable resistor closed switch configuration.

The composite material 10 generally includes conductive particles dispersed in an elastomeric polymer matrix. In some cases, carbon and/or metal may be used as conductive particles within a composite material 10. In some embodiments, conductive particles are made of nickel.

In some embodiments, conductive particles may have a smooth, rounded surface where a conduction path is created when particles are in contact with one another. FIG. 1C illustrates one embodiment of conductive particles that may be included in a composite material where the conductive particles have a smooth surface such as a rounded surface. When pressure is applied, more particles may come into contact and increasing layers of conduction pathways are formed, percolating through the elastomeric matrix.

In some cases, conductive particles may have an irregular structure providing for enhanced electrical conductivity. In some embodiments, metal particles may have a spiked surface that may be wetted (e.g., electrically insulated by silicone rubber), allowing metal particles to come close in proximity to one another, yet not physically touch, even when the composite material is squeezed or densely loaded. Spikes on a wetted particle surface may allow for a high concentration of electric charge to build up at the tips. Such increased charge on the spikes may be conducive to a high probability of quantum tunneling through lowering of the quantum tunneling barrier between particles. FIG. 1D illustrates one embodiment of conductive particles that may be included in a composite material where the conductive particles have an irregular surface such as a spiked surface. In some embodiments, conductive particles are star shaped.

Composite materials having conductive particles that are smooth (e.g., carbon) will show at least some conduction, typically with a resistance of a few thousand ohms, even in an unstressed state. However, in an unstressed state, a composite material having irregularly shaped particles (e.g., spiked) that are electrically insulated may exhibit a resistance of up to $10^{12}$ ohms. When pressure is applied, composite materials having smooth conductive particles may decrease to a few hundred ohms, whereas the resistance of composite materials having irregularly shaped particles that are wetted may be reduced to less that 1 ohm. When a sufficient mechanical pressure is applied to the composite material, resistance may drop exponentially as the composite material transitions from an insulator to a conductor.

Composite materials that are able to transition repeatably between insulative and conductive characteristics may be used in methods for testing PCBs. As discussed above, for some embodiments, a flexible sheet that includes a composite material may be applied on a PCB so that the composite material contacts regions of the PCB. Regions of the composite material disposed on areas of the PCB where pressure is applied would behave as a conductor, providing for an electrical pathway to be established at the respective area on the PCB. Accordingly, the electrical functionality at the area on the PCB where pressure is applied to the composite material may be easily measured and tested. Once appropriate areas on the PCB are suitably tested, the flexible sheet having the composite material may be removed from the PCB. It can be appreciated, for some embodiments, that the composite material is not required to be included in a flexible sheet, as the sheet may be rigid. In various embodiments, a first flexible or rigid PCB may be adhered to a composite material where the combination may then be applied to a second PCB for assessment.

As described, composite materials may also be used in forming and using an electrical switch. In an open state, an unstressed composite material may be disposed in between conductive members where the composite material behaves as an insulator. One or more actuating elements may be associated with the composite material such that upon application of a voltage difference to the actuating element(s), pressure is applied to the composite material. As a result of the pressure applied, the composite material behaves as a conductor, closing the electrical switch by forming an electrical pathway between conductive members. Accordingly, the electrical switch functions similarly to a transistor.

In some cases, when pressure is applied to a composite material, the composite material may exhibit anisotropic conductive properties. For example, conductivity may be greater in one particular direction as compared to another direction. A composite material exhibiting anisotropic properties may include any appropriate polymeric matrix to form a suitable material, such as an anisotropic conductive adhesive, an anisotropic conductive film, and/or an anisotropic conductive paste.

In some instances, the composite material may also exhibit isotropic conductive properties. For example, conductivity might not be orientation or direction dependent as pressure is applied.

An example of a material exhibiting one or more of the characteristics disclosed herein and other characteristics is a quantum tunneling composite, available from Peratech, Limited. Of course, the present invention is not limited in this respect, as other suitable materials may be employed, as well as materials exhibiting other characteristics.

FIG. 2A illustrates an embodiment of a first circuit 20 having circuit elements 24a, 24b, 24c, and 24d; and a second circuit 30 having circuit elements 34a, 34b, 34c, and 34d. Testing of second circuit 30 may occur by placing one or more circuit elements 34a, 34b, 34c, and 34d in electrical communication with one or more circuit elements 24a, 24b, 24c, and 24d of first circuit 20. Once an electrical pathway is established between one of circuit elements 24a, 24b, 24c, and 24d and one of circuit elements 34, 34b, 34c, and 34d, electrical functionality of the appropriate portion of the second circuit 30 (or vice versa for first circuit 20) may be assessed. As shown, circuit elements 24, 24b, 24c, and 24d and 34, 34b, 34c, and 34d are not yet placed in electrical communication, respectively, with one another.

First and second circuits 20 and 30 may be any suitable circuit package having semiconductor elements. For example, first and second circuits may both be PCBs. In some embodiments, first circuit 20 may be a top carrier package. In some embodiments, second circuit 30 may be a liquid crystal display (LCD) panel.

FIG. 2A also illustrates a composite material 50 having conductive particles 52 being disposed between the first circuit 20 and the second circuit 30. Although the figures portray conductive particles 52 as having round and smooth features, it can be appreciated that the conductive particles 52 are not so limited and may have irregular features, such as spikes, as described above and depicted, for example, in FIG. 1D.

Figure 2B:
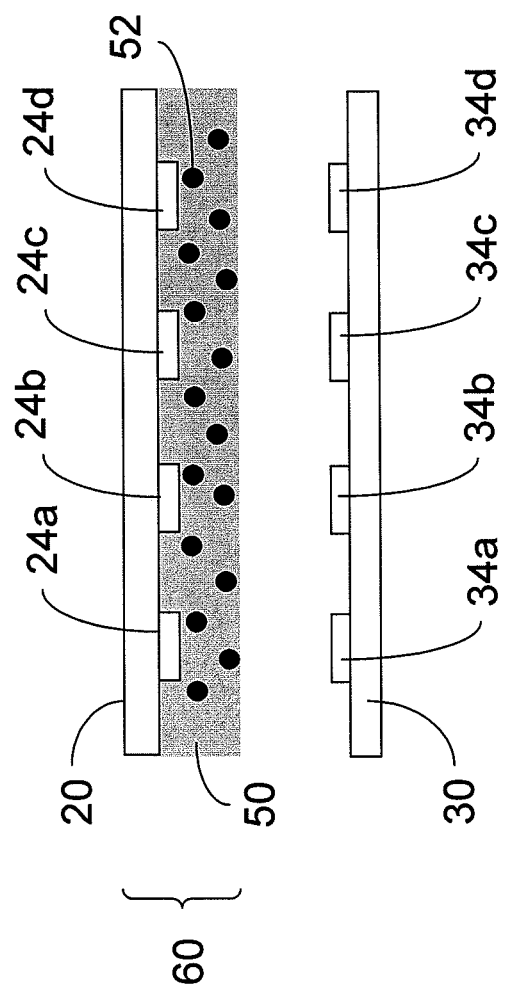
FIG. 2B depicts the composite material of FIG. 2A in contact with one of the circuits.

FIG. 2B depicts one embodiment of a composite material 50 in contact with the first circuit 20. In some embodiments, composite material 50 may be placed in contact with and adhered to first circuit 20 by use of an adhesive, glue, or bonding mechanism between composite material 50 and first circuit 20. For example, surfaces may be bonded using pressure and a curable resin. In one embodiment, in bonding a composite material and a circuit, a resin is heated up to 200 C for 20-30 seconds. In some embodiments, a composite material may be printed on a circuit, similar to methods of screen printing or solder resist printing. As a result, composite materials may be suitably patterned on to circuits or any other suitable surface. In some embodiments, a separate adhesive is unnecessary as a composite material 50 may include a material that naturally adheres to a circuit. It should be understood that any suitable method of keeping a composite material and a circuit in appropriate contact for a reasonable time may be used.

As illustrated in FIG. 2B, first circuit 20 and composite material 50 may be adhered to form a sheet 60. In some cases, sheet 60 may be a flexible sheet. Accordingly, if sheet 60 is flexible, first circuit 20 and composite material 50 may both be flexible. Having a sheet 60 that is flexible provides for easy application and removal to a test PCB, for example, second circuit 30. Examples of flexible circuit boards that may be tested include, but are not limited to, chip on flex, flex on flex, and flex on printed circuit board embodiments.

It can be appreciated that sheet 60 may be relatively rigid as well. For example, if first circuit 20 is rigid, then upon adherence of composite material 50 to first circuit 20, sheet 60 would be rigid. In some cases, a sheet 60 that is rigid may be relatively easy to handle as it would exhibit self-supporting characteristics.

Figure 2C:
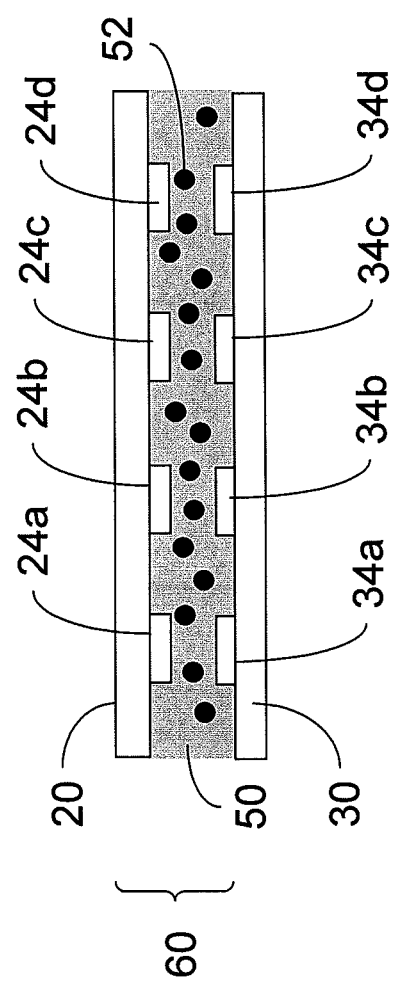
FIG. 2C shows the composite material of FIG. 2A in contact with both circuits.

FIG. 2C shows an illustrative embodiment of sheet 60 having been applied to second circuit 30. Sheet 60 may be placed in contact with second circuit 30 in any suitable manner. In some embodiments, sheet 60 is applied to circuit 30 by use of an appropriate adhesive, glue, or bonding mechanism. In some embodiments, a sheet 60 may be printed on a surface of a circuit by a suitable method of printing. In some embodiments, sheet 60 simply rests on top of second circuit 30. Composite material 50, having elastomeric properties, may also adhere slightly to second circuit 30. Although composite material 50 contacts circuit elements 24a, 24b, 24c, and 24d and 34a, 34b, 34c, and 34d, respectively, in FIG. 2C, composite material 50 may behave as an insulator. Accordingly, an electrical pathway is not yet established between any of circuit elements 24a, 24b, 24c, and 24d and 34a, 34b, 34c, and 34d.

In some embodiments, a composite material 50 may be patterned on areas of a PCB so that regions of another PCB (e.g., ball grid array) may be easily tested. For example, regions of the composite material 50 may be printed to complement regions on a PCB to be tested. FIG. 3 illustrates an embodiment of a sheet 60 including a composite material being used for testing a ball grid array (BGA) 70. The surface of the BGA includes a number of contact elements, for example, solder balls 74a, 74b, and 74c. Sheet 60 also includes circuit elements (not shown in FIG. 3) that, when placed in electrical connection with contact elements (e.g., balls) on the BGA, provide a method of testing internal PCB structures of the BGA. As depicted, a sheet 60 including the composite material is applied to the BGA 70 such that the composite material contacts contact elements on the BGA. When the sheet contacts elements of the BGA, no initial pressure that is sufficient to induce conductivity in the composite material is applied to the sheet. To test the BGA, pressure is applied to regions of the sheet that is sufficient to cause the portion of the composite material where pressure is exerted to become conductive. As a result, an electrical pathway is created on a region of the BGA that is adjacent to the portion of the composite material that is under pressure. The electrical pathway created provides a method of testing that particular region of the BGA. After selected portions of the BGA are tested, the sheet is removed from the BGA.

Figure 4:
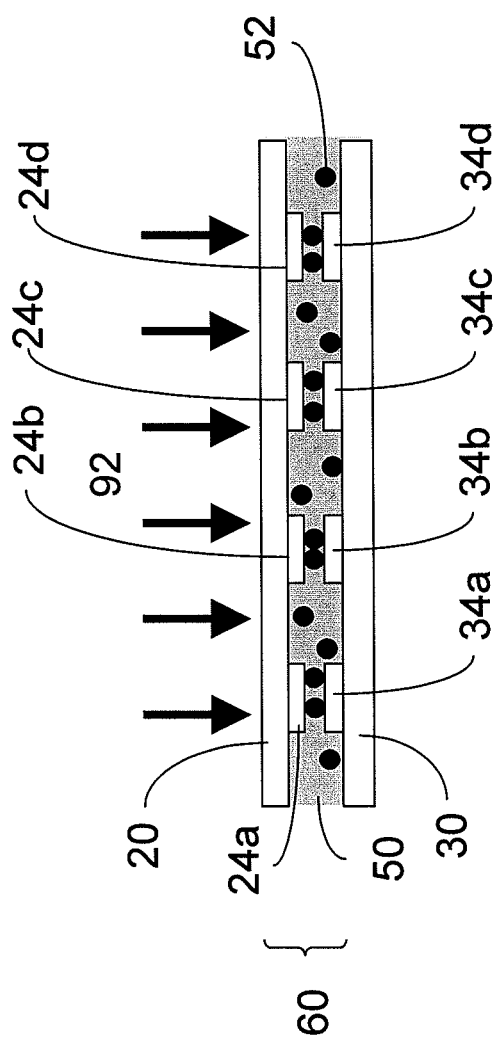
FIG. 4 shows a composite material disposed between two circuits where a uniform pressure is applied.

FIG. 4 depicts an embodiment of a uniform pressure 92 being applied to sheet 60 such that the overall thickness of composite material 50 may be reduced. Though it is not a necessary requirement for the thickness of the composite material 50 to be reduced, thickness reduction can result from pressure application to the sheet 60, particularly if the sheet is flexible. For some embodiments, pressure applied to sheet 60 may result in a thickness reduction of first circuit 20. In some embodiments, when pressure is applied, no noticeable reduction in thickness of the sheet 60 occurs.

Regardless of thickness variations, in some cases, FIG. 4 may illustrate a pressure applied to the composite material 50 disposed between the two circuits that is sufficient to effectively change portions of the composite material 50 from an insulator to a conductor. If the pressure applied to the composite material 50 is sufficient for the composite material to exhibit conductive properties, an electrical pathway may then be established between circuit element(s) 24a, 24b, 24c, and 24d and 34a, 34b, 34c, and 34d, respectively.

Although FIG. 4 illustrates conductive particles 52 as being in actual contact with each other and/or circuit elements 24a, 24b, 24c, and 24d and 34a, 34b, 34c, and 34d, it can be appreciated that physical contact between conductive portions of particles 52 is not a necessary requirement as quantum tunneling may occur upon pressure application so as to create an electrical pathway between circuit elements. Once pressure sufficient to change the composite material 50 from an insulator to a conductor is removed from the sheet 60, the composite material 50 reverts back to being an insulator.

However, in some cases, FIG. 4 may illustrate simple adherence of first circuit 20, composite material 50, and second circuit 30 where pressure applied is insufficient to change portions of the composite material 50 from an insulator to a conductor. In such cases, an electrical pathway is yet to be established between circuit elements of first and second circuits 20 and 30.

Figure 5:
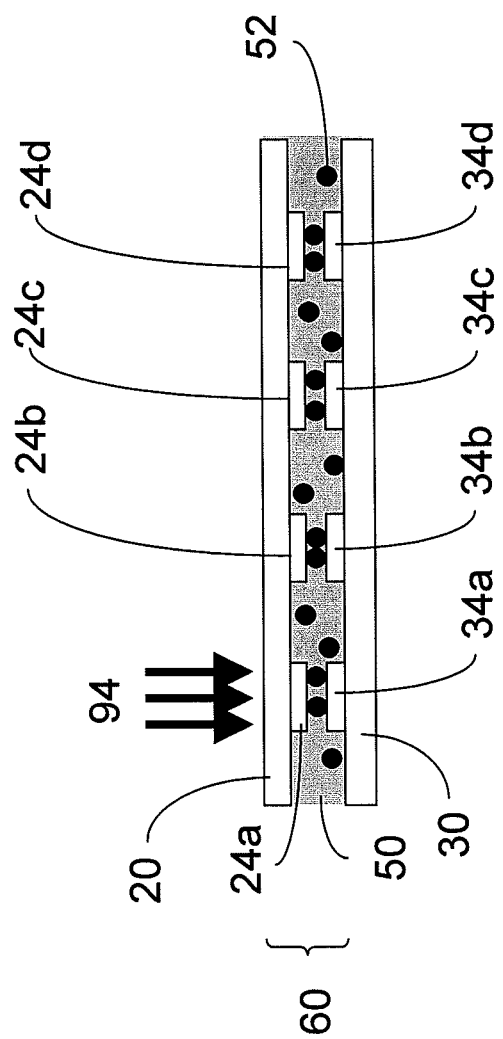
FIG. 5 shows a composite material disposed between two circuits where a local pressure is applied.

In one illustrative embodiment, a composite material 50 may be sandwiched between two PCBs where a mechanical pressure is applied, for example, by clamping. Although a pressure may exist between the PCBs and composite material, added pressure may be required for an electrical pathway to be established between circuit elements on the PCBs. Such pressure may be provided from a variety of suitable sources, for example, a finger, an actuator, or other appropriate instrument. For example, FIG. 5 shows, in one embodiment, a composite material 50 that is sandwiched between a first circuit 20 and a second circuit 30 where an added local pressure 94 is applied at circuit elements 24a and 34a. Even though first circuit 20 and second circuit 30 are in close proximity to one another and a residual or existing pressure may be present, composite material 50 may still function as an insulator in regions including circuit elements 24b, 24c, 24d and circuit elements 34b, 34c, and 34d, respectively. Accordingly, local pressure 94 provides the pressure sufficient for an electrical pathway to be established between circuit elements 24a and 34a through the composite material. After areas of the PCB to be assessed are sufficiently tested, the mechanical pressure between the composite material and either PCB may be appropriately removed.

In some embodiments, devices may include a composite material that is pre-compressed to exhibit conductive properties without external pressure application. In such cases, when the composite material is stretched to a sufficient degree so as to pull conductive particles further apart, the region of the composite material where stretching occurs becomes more resistive. For example, a composite material 50 that is disposed between a first circuit 20 and a second circuit 30 may, in a rest state, be in a closed switch configuration where the composite material 50 exhibits conductive characteristics and elements on the first and second circuits are electrically connected. However, when a region of the composite material 50 is sufficiently stretched so that the portion that is stretched becomes insulative, elements of the first and second circuits are then in an open switch configuration at that region of stretching.

As discussed above, in some cases, composite material 50 may exhibit anisotropic conductive properties. In some embodiments, a pressure applied to a composite material may result in an increased electrical conductivity in a direction that is between circuit elements on opposing circuits (vertically). Yet, for the same composite material, application of such a pressure may result in the material remaining insulative between circuit elements on the same circuit (horizontally). Conversely, when pressure is applied to a composite material, the material may exhibit electrical conductivity horizontally, yet may remain insulative vertically.

Conductive anisotropy in composite materials may be due to a number of factors. For example, conductive particles may inherently contain anisotropic characteristics, or the distribution of particles within composite materials may give rise to naturally anisotropic characteristics.

Figure 6:
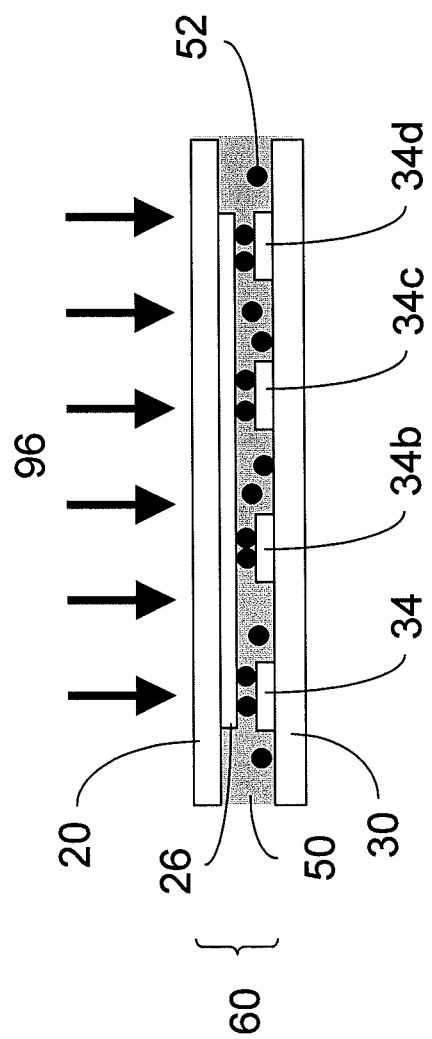
FIG. 6 shows another embodiment of a composite material disposed between two circuits that are pressed together.

In some embodiments, first circuit 20 includes a number of circuit elements 24a, 24b, 24c, and 24d, as shown in FIGS. 4 and 5, or a single circuit element 26, as illustrated in FIG. 6. In one embodiment, depicted in FIG. 6, a uniform pressure 96 applied to a sheet 60 such that the composite material 50 behaves as a conductor allows for an electrical pathway to be established between circuit element 26 and each of circuit elements 34a, 34b, 34c, and 34d. Once this pressure 96 is removed from the sheet 60, the composite material 50 reverts back to being an insulator.

Figure 7:
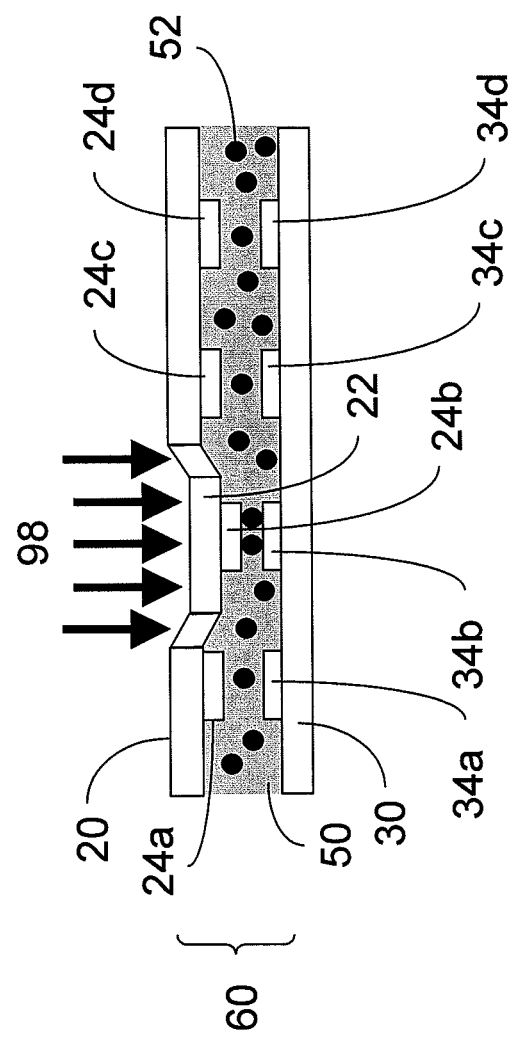
FIG. 7 shows a composite material disposed between two circuits where a local pressure is applied.

FIG. 7 illustrates an embodiment where a local pressure 98 is applied to a compliant portion of sheet 60, where the pressure is sufficient for composite material 50 to behave as a conductor. Local pressure 98 may be transferred to a portion 22 of the first circuit 20 and a portion of the composite material 50. As a result, the portion of composite material 50 where pressure is applied exhibits a decreased electrical resistance. However, regions of the composite material 50 where pressure is not applied remain to exhibit insulative properties. Accordingly, and as depicted in FIG. 7, an electrical pathway is established between circuit elements 24b and 34b due to the pressure applied at those regions sufficient for composite material 50 to be electrically conductive. Additionally, because pressure that is sufficient for composite material 50 to be electrically conductive is not applied to other regions, an electrical pathway is not established between circuit elements 24a, 24c, and 24d and 34a, 34c, and 34d, respectively. Once local pressure 98 is removed from the sheet 60, the composite material 50, in the region where the pressure 98 had been applied, reverts back to having insulative characteristics.

Any appropriate pressure distribution and frequency of pressure application may be provided on the sheet 60. It can be appreciated that in testing the electrical functionality of circuits, a variety of tests may be conducted at various locations on the circuit. Such tests are often repeated so that usability of the circuit may be well assessed.

Figure 8:
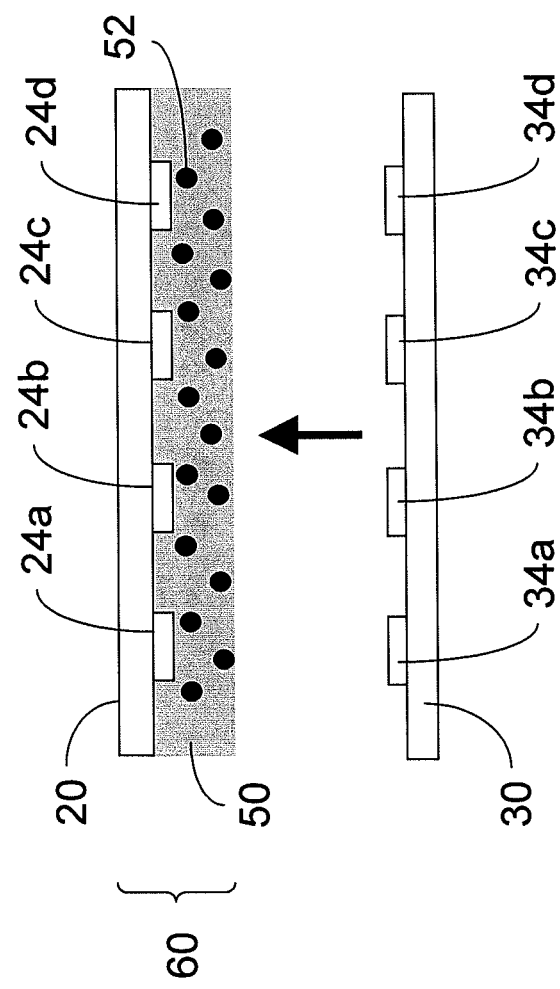
FIG. 8 depicts a composite material in contact with one circuit being lifted away from another circuit.

Sheet 60 may be removed by any appropriate method. As illustrated in FIG. 8 for one embodiment, sheet 60 may be lifted away from second circuit 30. In some instances not explicitly shown, sheet 60 is flexible and can be appropriately peeled away from second circuit 30.

As an example not shown in the figures, a sheet that is flexible, having a top carrier package, may be applied to an LCD panel. Upon application of the sheet to the LCD panel, because no pressure, hence change in conductivity, would yet be applied between the sheet and the LCD panel, no light emittance would yet arise. However, when a local pressure (e.g., from a finger depression) is applied at a portion of the sheet, light from the LCD panel would be emitted at the region where the pressure is applied due to the electrical pathway created by the composite material. When the local pressure is removed, light emission from that portion of the LCD panel would cease. Such testing may be repeated, as desired. It can be appreciated, as set forth in this example, that regions of the circuit (e.g., LCD panel) may be easily tested through simple application of a sheet having a composite material and subsequent removal of that sheet from the circuit.

In one embodiment, when using a composite material to test a PCB, a flexible sheet that includes the composite material is formed. The flexible sheet is applied to the PCB in a manner such that the composite material contacts the PCB. For example, the composite material may be disposed on the bottom of the flexible sheet, allowing for easy contact with the PCB. Upon application of the flexible sheet to the PCB, no initial pressure is applied that is sufficient to induce conductivity in the composite material. When testing the PCB, pressure is applied to the flexible sheet that is sufficient to cause the portion of the composite material where pressure is exerted to exhibit conductive characteristics. Due to an electrical pathway being created on a region of the PCB that is adjacent to the portion of the composite material that is under pressure, electrical functionality at particular regions of the PCB may be appropriately measured. Once testing of the PCB is completed, the flexible sheet may be easily removed from the PCB. For example, the flexible sheet may be lifted or peeled off the PCB.

Several benefits may be afforded by the method described herein. Testing of regions on a PCB by pressure application at selected locations is both simple and compatible with the PCB printing and manufacturing process. The method may provide a substantial cost savings, as sockets for testing the PCB are no longer required, and a smaller footprint may be printed on the circuit. In addition, such a method may be used for testing a variety of chip configurations, such as flip chips and stacked chips, for example.

Furthermore, as previously discussed, in one embodiment, composite materials may be used as part of an electrical switch that can be activated by an independent actuating mechanism through application of a voltage. Composite materials described may be used to provide thin film transistor arrangements (e.g, for display backplanes) comparable to amorphous silicon transistors. In some embodiments, significant portions of an active matrix thin film transistor backplane can be manufactured from transistor arrangements described herein. It may also be possible for thin film transistor arrangements discussed to be manufactured at a small length scale (e.g., 100×100 microns) as well as manufactured on flexible substrates (e.g, PET, PI).

Figure 9:
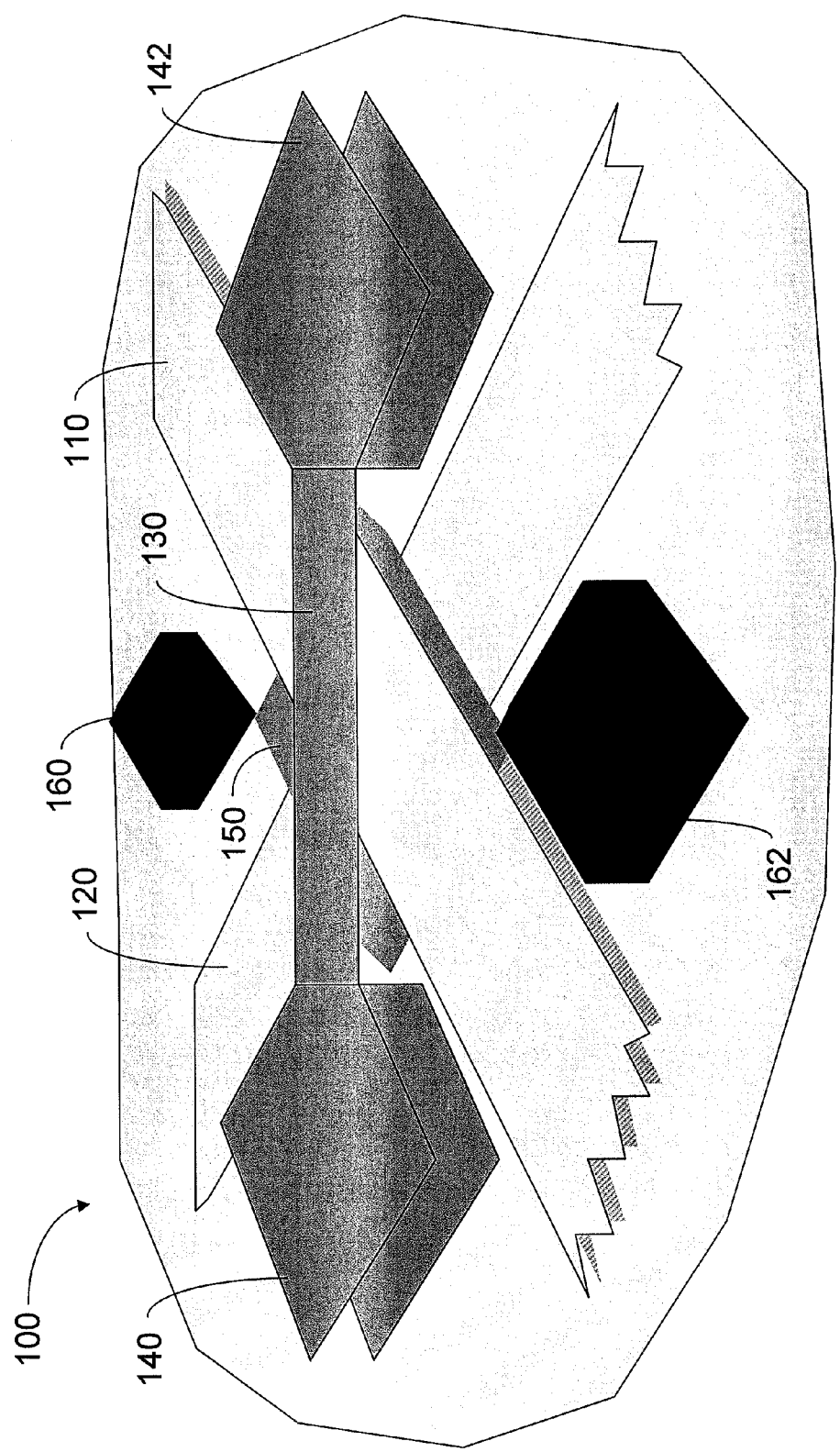
FIG. 9 depicts an electrical switch that includes a composite material disposed between two conductive members and actuating elements on two sides of the composite material.
Figure 10:
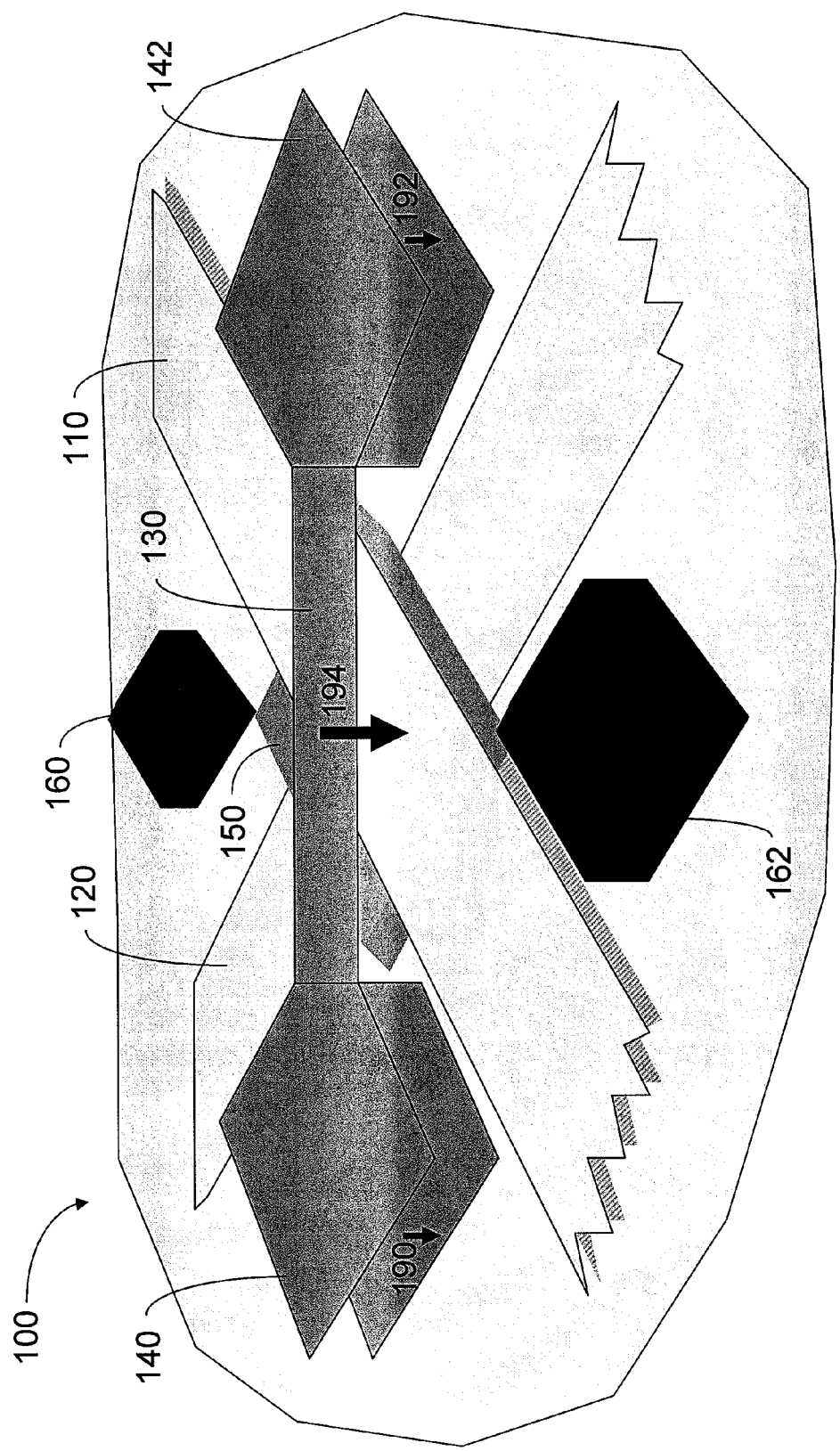
FIG. 10 depicts the electrical switch of FIG. 9 where application of a voltage difference to the actuating elements applies a pressure to the composite material.

FIGS. 9 and 10 depict an illustrative embodiment of an electrical switch 100 that includes a composite material 150 that is disposed in between a first conductive track 110 and a second conductive track 120. First conductive track 110 is disposed adjacent to a bridge 130 that connects capacitors 140 and 142. The bridge 130 is relatively rigid and capacitors 140 and 142 include a dielectric elastomer disposed in between plates. Spacers 160 and 162 are provided to protect the system from external forces. Spacers may be relatively hard and, as shown, may be disposed adjacent to first and second conductive tracks 110 and 120. In various embodiments, first and second conductive tracks 110 and 120 may be electrically connected to an integrated circuit.

In an open switch configuration, composite material 150 acts as an insulator and electrical current is unable to pass between first and second conductive tracks 110 and 120.

In bringing the system to a closed switch configuration, shown in FIG. 10, when a voltage difference is applied to capacitors 140 and 142, the dielectric elastomer materials included in the capacitors provide a downward pressure actuation 190 and 192 so as, further, to apply a pressure 194 to the bridge 130. As described previously, in one embodiment, bridge 130 includes a rigid portion that is in contact with the capacitors 140 and 142. Bridge 130 transfers the pressure from the capacitors to the first conductive track 110 which subsequently acts to apply a pressure to composite material 150 that is appropriate for the composite material to behave as a conductor. Hence, actuation of the capacitors 140 and 142 through application of a sufficient voltage difference provides for an electrical pathway between the first and second conductive tracks 110 and 120 to be established. In some embodiments, when pressure is applied to the composite material, first and second conductive tracks 110 and 120 are brought closer to one another as the thickness of the composite material separating the conductive tracks may be reduced. However, in other embodiments, when pressure is applied to the composite material, the thickness of the composite material separating first and second conductive tracks 110 and 120 remains relatively unchanged.

The principles presented herein may be applied to providing an electrical switch between any number of conductive members. Indeed, first and second conductive tracks 110 and 120 are provided as only an illustrative embodiment, as other conductive elements may be used in such configurations. Similarly, the use of capacitors having dielectric elastomers (e.g., squeezable plastic, polyurethane) is only one illustrative method for providing an actuating element that is activated by application of a voltage difference to the actuating element. Indeed, other electroactive materials or polymers may be utilized as actuating elements as provided herein. For example, piezoelectric materials that are actuated by a voltage difference may function to apply pressure to a composite material for closing an electrical switch.

Also, other arrangements for using one or more actuating elements to apply pressure to a composite material that is disposed between two conductive members may be contemplated. In some embodiments, one or more actuating elements may be used to directly apply pressure to one of the conductive members, rather than indirectly transferring pressure from the actuating element(s) through a bridge or an appropriate rigid portion. For example, an actuating element, such as a dielectric elastomer, may be in direct contact with a conductive member. When a voltage difference is provided to the actuating element, a pressure is applied directly to the conductive member and transferred to the composite material so that the electrical switch is closed. In some embodiments, one or more actuating elements may be used to directly apply pressure to the composite material. In such a case, an actuating element may be in contact with the composite material, rather than a bridge or one of the conductive members, and the actuating element may serve to apply pressure upon application of a voltage difference. For example, actuating elements may surround the composite material and, when a voltage is applied, actuating elements may be configured to actuate directly into the composite material. Upon the composite material transitioning from an insulator to a conductor, the electrical switch is closed. In some embodiments, and as may be contemplated above, a single actuating element may be used, rather than multiple actuating elements.

Furthermore, mechanical pressure may be supplied from other energy types, such as electrical and/or magnetic energy. For example, if a magnetic material, such as nickel in the form of particles, is used in the composite material, application of a magnetic field may give rise to a mechanical pressure in the composite material and, hence, an increased conductivity. As a result, when a magnetic field is applied to the composite material, an electrical pathway can be established between conductive members.

The resistance of composite materials described herein may vary non-linearly with mechanical pressure. However, it can be appreciated that such non-linearity may be tunable through manipulation of properties and distribution of conductive particles within the composite materials. For example, the diameter, shape, and density of particles may be appropriately adjusted to suit desired conductivity characteristics of the composite material. In some cases, where a small amount of pressure at a particular location may be desirable for transition of a composite material from an insulator to a conductor, the density of particles may be increased. Conversely, where a large pressure threshold may be required at a particular location for transition of a composite material from an insulator to a conductor, the density of particles may be decreased. It should be understood that composite materials may be selectively manufactured for particular applications.

Having thus described several aspects of at least one embodiment of this invention, it is to be appreciated various alterations, modifications, and improvements will readily occur to those skilled in the art. Such alterations, modification, and improvements are intended to be part of this disclosure, and are intended to be within the spirit and scope of the invention. Accordingly, the foregoing description and drawings are by way of example only.

What is claimed is:

1. A method of testing a printed circuit board using a composite material, the method comprising:
    forming a flexible sheet, the flexible sheet including the composite material, wherein forming the flexible sheet comprises providing a quantum tunneling composite as the composite material, wherein the quantum tunneling composite comprises particles and wherein at least two particles are capable of forming an electrical pathway therebetween without physical contact;
    applying the flexible sheet to the printed circuit board such that the flexible sheet is disposed on the printed circuit board, wherein the composite material contacts the printed circuit board;
    applying a pressure to a top surface of the flexible sheet, and as a result to a portion of the composite material, while the flexible sheet is disposed on the printed circuit board, wherein application of the pressure to the flexible sheet causes the portion of the composite material to become less electrically resistant and an electrical pathway is created on a section of the printed circuit board that is adjacent to the portion of the composite material that is under pressure;
    measuring an electrical functionality of at least the section of the printed circuit board based on the electrical pathway that is created; and
    removing the flexible sheet from the printed circuit board at a completion of a test.

2. The method of claim 1, wherein forming the flexible sheet comprises providing an adhesive material between a first conductor and the composite material.

3. The method of claim 1, wherein forming the flexible sheet comprises providing an anisotropic conductive material as the composite material, the anisotropic conductive material being selected from the group consisting of an anisotropic conductive adhesive, an anisotropic conductive film, and an anisotropic conductive paste.

4. The method of claim 1, wherein forming the flexible sheet comprises providing a flexible circuit board with the composite material.

5. The method of claim 1, wherein testing the printed circuit board comprises testing a surface mount package, the surface mount package being selected from the group consisting of a ball grid array, a quad flat no leads package, and a quad flat package.

6. The method of claim 1, wherein testing the printed circuit board comprises testing a printed circuit board having no sockets.

7. The method of claim 1, wherein testing the printed circuit board comprises testing a flexible circuit board, the flexible circuit board being selected from the group consisting of a chip on flex, a flex on flex, and a flex on printed circuit board.

8. The method of claim 1, wherein applying the pressure to the portion of the composite material comprises reducing a thickness of the composite material.

* * * * *